(12) United States Patent
Chih et al.

(10) Patent No.: US 7,495,960 B2
(45) Date of Patent: Feb. 24, 2009

(54) PROGRAM METHODS FOR SPLIT-GATE MEMORY

(75) Inventors: Yue-Der Chih, Hsin-Chu (TW); Shih-Wei Wang, Hsin-Chu (TW); Derek Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 37 days.

(21) Appl. No.: 11/524,128

(22) Filed: Sep. 20, 2006

(65) Prior Publication Data

US 2008/0068887 A1 Mar. 20, 2008

(51) Int. Cl.
*G11C 16/04* (2006.01)

(52) U.S. Cl. ............................ 365/185.18; 365/185.23; 365/185.33

(58) Field of Classification Search ............ 365/185.18, 365/185.23, 185.33, 189.09, 185.03, 185.05, 365/185.11, 189.05
See application file for complete search history.

(56) References Cited

U.S. PATENT DOCUMENTS

| | | | | |
|---|---|---|---|---|
| 5,966,331 A | * | 10/1999 | Shiau et al. ............. | 365/185.23 |
| 5,978,277 A | * | 11/1999 | Hsu et al. ............... | 365/185.29 |
| 6,005,809 A | * | 12/1999 | Sung et al. ............. | 365/185.29 |
| 6,233,177 B1 | * | 5/2001 | Shokouhi et al. ....... | 365/185.23 |
| 7,342,828 B2 | * | 3/2008 | Ishii et al. .............. | 365/185.18 |

* cited by examiner

*Primary Examiner*—David Lam
(74) *Attorney, Agent, or Firm*—Slater & Matsil, L.L.P.

(57) ABSTRACT

An array of flash memory cells includes a first sector comprising a plurality of rows wherein each row is connected to a control-gate line, a first row comprising a first flash memory cell in the first sector, a first control-gate line connecting control-gates of flash memory cells in the first row, a second row in the first sector and comprising a second flash memory cell sharing a common source-line and a same bit-line with the first flash memory cell, a second control-gate line connecting control-gates of memory cells in the second row wherein the first and the second control-gate lines are disconnected from each other, a second sector comprising a plurality of rows wherein each row is connected to a control-gate line, and a positive high-voltage (HV) driver connected to the first control-gate line in the first sector and a control-gate line in the second sector.

14 Claims, 4 Drawing Sheets

PROGRAM METHODS FOR SPLIT-GATE MEMORY

TECHNICAL FIELD

This invention relates generally to integrated circuits, and more particularly to programming methods for flash memory cells.

BACKGROUND

Flash memory has become increasingly popular in recent years. A typical flash memory comprises a memory array having a large number of memory cells arranged in blocks. Each of the memory cells is fabricated as a field-effect transistor having a control-gate and a floating-gate. The floating-gate is capable of holding charges and is separated from source and drain regions contained in a substrate by a layer of thin oxide. Each of the memory cells can be electrically charged by injecting electrons from the drain region through the oxide layer onto the floating-gate. The charges can be removed from the floating-gate by tunneling the electrons to the source through the oxide layer during an erase operation. The data in a memory cell is thus determined by the presence or absence of a charge on the floating-gate.

Flash memory cells come in two major types: stack-gate flash cells and split-gate flash cells. FIG. 1 illustrates two exemplary split-gate flash memory cells 2 and 20. Flash memory cell 2 includes floating-gate 4, control-gate 6 over floating-gate 4, insulation layer 8 electrically insulating floating-gate 4 and control-gate 6, and word-line 10 formed over channel region 12 and on sidewalls of floating-gate 4 and control-gate 6. Word-line 10 controls the conduction of channel 12, which is located between bit-line node 14 and source 16. During a program operation, a voltage is applied between bit-line node 14 and source 16, with, for example, a bit-line node voltage of about 0.4V and a source voltage of about 4V. Word-line 10 is applied with a voltage of 1.5V to turn on channel 12. Therefore, a current flows between bit-line node 14 and source 16. A high voltage, for example, about 10V, is applied on control-gate 6, and thus electrons are programmed into floating-gate 4 under the influence of a high electrical field.

Flash memory cells 2 and 20 have a common source 16. Typically, control-gate 22 of flash memory cell 20 is connected to control-gate 6, and bit-line node 24 is connected to bit-line node 14. During the program operations of flash memory cell 2, a low voltage, for example, 0V, is applied on word-line node 28, and thus a channel region under word-line node 28 is closed. Such a connection scheme, however, suffers drawbacks. In order to expedite the program operation, a high voltage is preferably applied on source 16 to increase program currents. However, because bit-line node 14 is connected to bit-line node 24 of flash memory cell 20, and further because source 16 is shared by flash memory cells 2 and 20, the same voltage applied between bit-line node 14 and source 16 will also be applied between bit-line node 24 and source 16. Due to the high voltage applied on control-gate 22 (due to the high voltage applied on control-gate 6), a weak program occurs to flash memory cell 20, which causes a small amount of electrons to be programmed into floating-gate 26. Such an effect is typically referred to as disturb.

The disturb causes a significant reduction in the sizes of program windows, in which the program operations of flash memory cell 2 can be programmed without causing substantial disturb to flash memory cell 20. Program currents, hence program speeds, are thus limited. Accordingly, new program methods are needed.

SUMMARY OF THE INVENTION

In accordance with one aspect of the present invention, an array of flash memory cells arranged in a plurality of rows and a plurality of columns includes a first sector comprising a plurality of rows wherein each row is connected to a control-gate line, a first row comprising a first flash memory cell in the first sector, a first control-gate line connecting control-gates of flash memory cells in the first row, a second row in the first sector and comprising a second flash memory cell sharing a common source-line and a same bit-line with the first flash memory cell, a second control-gate line connecting control-gates of flash memory cells in the second row wherein the first and the second control-gate lines are disconnected from each other, a second sector comprising a plurality of rows wherein each row is connected to a control-gate line, and a positive high-voltage (HV) driver connected to the first control-gate line in the first sector and a control-gate line in the second sector.

In accordance with another aspect of the present invention, an integrated circuit includes an array of memory cells arranged in a plurality of rows and a plurality of columns, wherein the rows are grouped as at least a first sector and a second sector each having a same number of rows. The array includes a plurality of control-gate lines connected to the rows of memory cells of the array with a control-gate line connected to control-gates of memory cells in a same row, the rows of memory cells being arranged in pairs, wherein, in each pair of rows, a first row of the pair shares common sources and common bit-lines with a second row of the pair, and control-gate lines of the first and the second rows are disconnected from each other, a plurality of bit-lines connected to the columns of memory cells of the array with a bit-line connected to memory cells in a same column, a plurality of positive high voltage (HV) drivers, each being connected to a control-gate line in the first sector and a respective control-gate line of a respective row in the second sector, and a first and a second negative HV driver connected to the first and the second sectors, respectively.

In accordance with yet another aspect of the present invention, an integrated circuit includes an array of memory cells arranged in a plurality of rows and a plurality of columns, wherein the array is divided into at least a first sector and a second sector. Each of the first and the second sectors includes a plurality of control-gate lines, each control-gate line being connected to a row of the array, wherein control-gate lines of rows having common-source memory cells are disconnected, a plurality of first switches, and a plurality of second switches. Each switch in the plurality of first switches has a first end connected to one of the control-gate lines and a second end connected to a positive HV driver, wherein the second end of each first switch in the first sector is connected to the second end of a first switch in the second sector. Each switch in the plurality of second switches has a first end and a second end, wherein each first end is connected to one of the control-gate lines, and wherein each second end in the first and the second sectors are interconnected and further connected to a negative HV driver.

The advantageous features of the present invention includes reduced disturb between common-source flash memory cells and increased program window.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
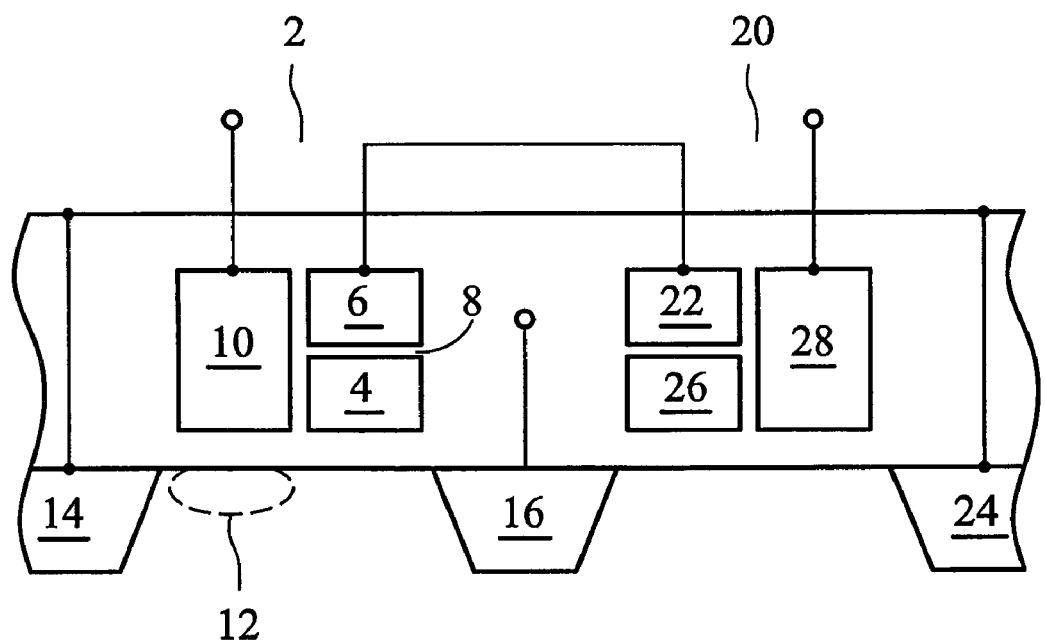
FIG. 1 illustrates two conventional common-source flash memory cells having interconnected control-gates.
Figure 2A:
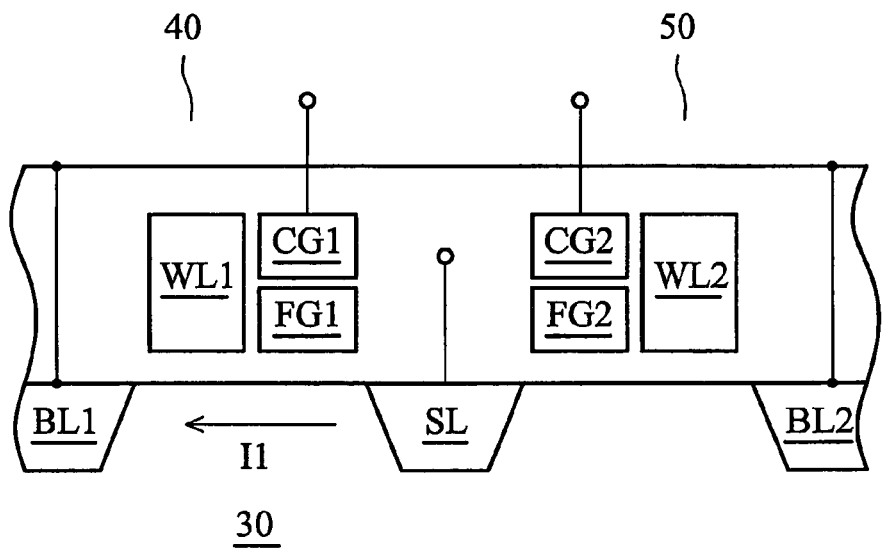
FIG. 2A illustrates two common-source flash memory cells having disconnected control-gates.

FIG. 2A illustrates an embodiment of the present invention, which includes two common-source flash memory cells 40 and 50 formed on a semiconductor substrate 30. Throughout the description, the term "common-source flash memory cells" is used to refer to flash memory cells sharing common sources. Flash memory cell 40 includes floating-gate FG1, control-gate CG1 (also referred to as coupling gate CG1), word-line node WL1 and bit-line node BL1. Flash memory cell 50 includes floating-gate FG2, control-gate CG2, word-line node WL2 and bit-line node BL2. Flash memory cells 40 and 50 share a common source SL. Bit-line nodes BL1 and BL2 are interconnected.

Figure 2B:
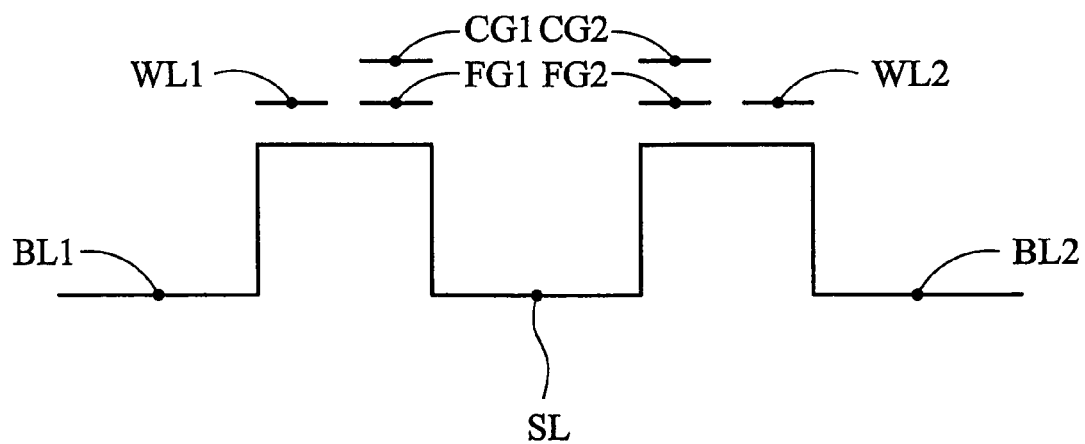
FIG. 2B illustrates a symbol of the flash memory cells shown in FIG. 2A.

FIG. 2B illustrates a symbol of flash memory cells illustrated in FIG. 2A, wherein like reference numerals are used to indicate like features.

Referring back to FIG. 2A, in the preferred embodiment, control-gates CG1 and CG2 are disconnected from each other, and thus may be connected to different voltages. During a program operation of flash memory cell 40, a voltage is applied between bit-line node BL1 and common source SL, with, for example, a bit-line voltage of about 0.4V and a common source voltage of about 4V. Word-line node WL1 is applied with a voltage, for example, about 1.5V, in order to turn on a channel in substrate 30. Therefore, a current I1 flows between common source SL and bit-line node BL1. A high control-gate voltage, for example, about 10V, is applied on control-gate CG1, and thus electrons are programmed into floating-gate FG1 under the influence of a high electrical field.

At the time flash memory cell 40 is programmed, control-gate CG2 of flash memory cell 50 is connected to a low voltage, for example, about 0V. Since there is no high electrical field between control-gate CG2 and substrate 30, weak programming is thus substantially eliminated. As a result, substantially no disturb occurs to flash memory cell 50 when flash memory cell 40 is programmed. The program window is thus increased.

Figure 3:
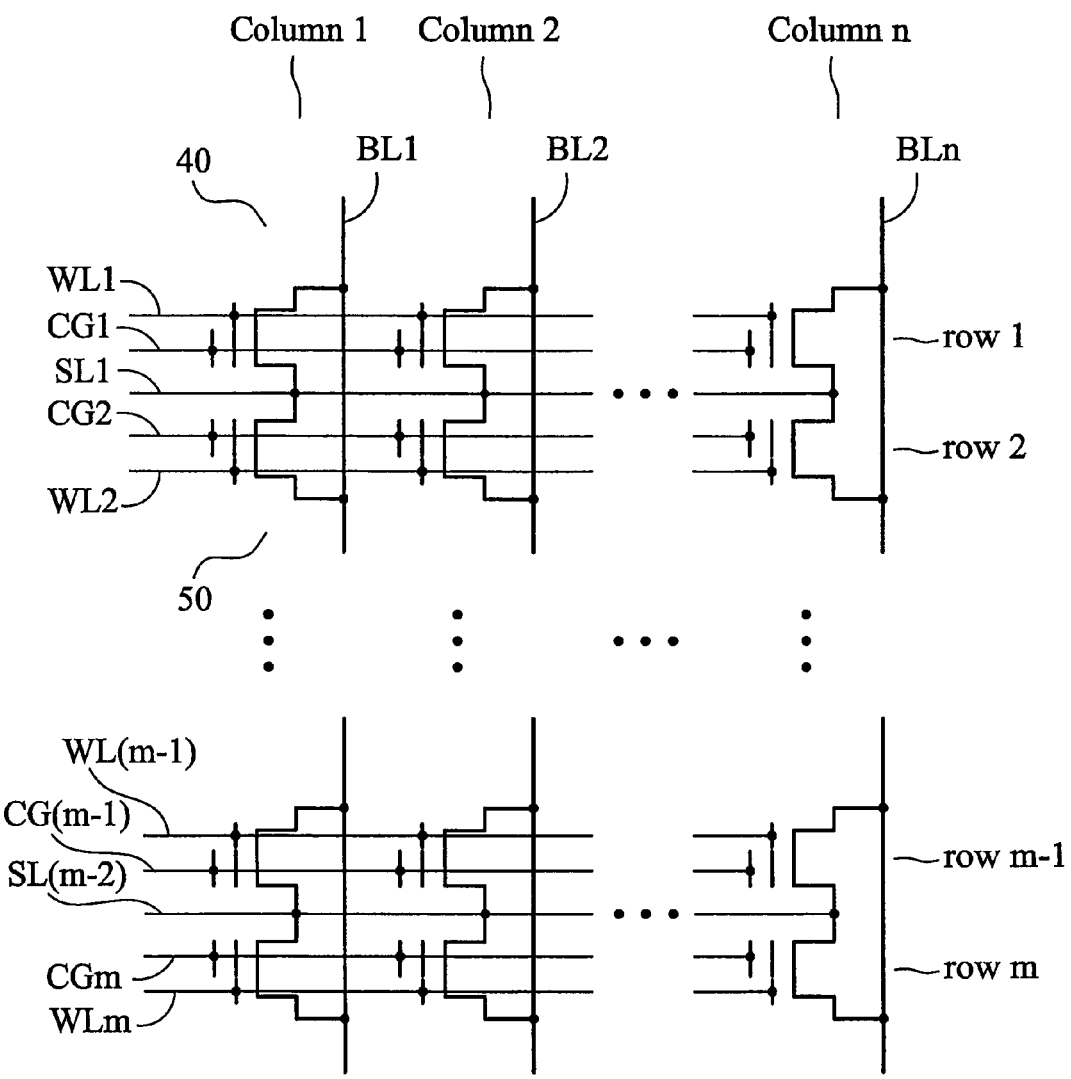
FIG. 3 illustrates a flash memory array embodiment.

FIG. 3 illustrates an exemplary connection of the above-discussed flash memory cells into an array of flash memory cells. The array includes a plurality of flash memory cells arranged into rows and columns, wherein the rows are denoted as rows 1 through m, and the columns are denoted as columns 1 through n, wherein m and n are integers. Flash memory cells 40 and 50 shown in FIG. 2B are illustrated in the first column with row numbers 1 and 2, respectively, although flash memory cells 40 and 50 may be placed in other locations of the array, and the flash memory array essentially includes the repetition of memory cells 40 and 50.

In the preferred embodiment, there are m word-lines denoted as WL1, WL2, . . . , and WLm, m control-gate lines denoted as CG1, CG2, . . . , and CGm, m/2 source lines denoted as SL1, . . . , and SL(m/2). Word-lines WL1 through WLm, control-gate lines CG1 through CGm and source-lines SL1 through SL(m/2) are preferably arranged in the direction of rows. Word-lines WL1 through WLm are connected to word-line nodes of flash memory cells in respective rows. Control-gate lines CG1 through CGm are connected to control-gates of flash memory cells in respective rows. Each source-line SL1 through SL(m/2) is connected to sources of flash memory cells in two neighboring rows. Further, there are n bit-lines, which are denoted as BL1, BL2, . . . , BLn, arranged in column directions, and each bit-line is connected to the bit-line nodes of the memory cells in the respective columns.

In FIG. 3, flash memory cell 40 is connected to word-line WL1 and control-gate line CG1, and flash memory cell 50 is connected to word-line WL2 and control-gate line CG2. A common source-line SL1 is shared by flash memory cells in row 1 and row 2. Such a connection scheme makes it possible for separate voltages to be applied to control-gate lines CG1 and CG2, and thus increases the programming windows of flash memory cells 40 and 50. Similarly, throughout the array, each of the two neighboring rows from a row pair may share a common source line, while their control-gate lines are disconnected.

In order to apply different voltages to neighboring rows with common source lines, each row of the memory array may be connected to a HV driver (referred to as a positive HV driver hereinafter) for program operations. However, such a scheme requires m positive HV drivers, which occupy a significant amount of chip area. An improved embodiment for providing program voltages is illustrated in FIG. 4, wherein like reference symbols are used to indicate like features as in FIG. 3.

In the preferred embodiment, the multiple rows of the flash memory array are divided into more than one sector (also referred to as a page in the art). Preferably, all flash memory cells in each of the sectors are erased simultaneously. However, different rows may be programmed individually. For simplicity, only two sectors, sector 1 and sector 2, are illustrated. Each of the sectors includes 8 rows. It should be appreciated that the row amount 8 is merely an example, and each sector may include different numbers of rows, such as 2, 4, 8, 16, etc.

Figure 4:
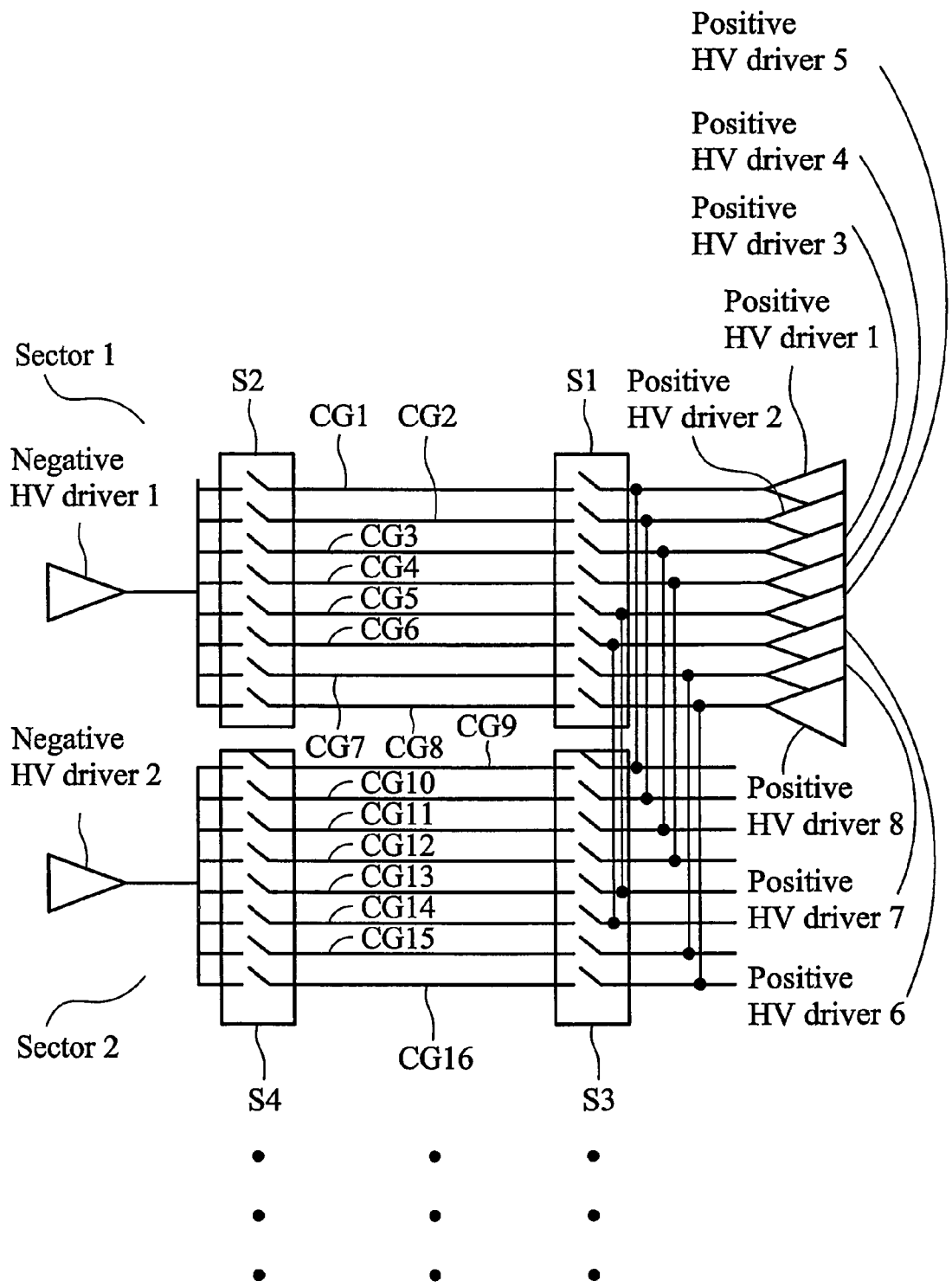
FIG. 4 is a connection scheme for connecting control-gate lines of flash memory arrays to high-voltage drivers.

In FIG. 4, control-gate lines CG1 through CG8 are illustrated, wherein each of the control-gate lines is either a respective control-gate line illustrated in FIG. 3, or a line connected to a control-gate line illustrated in FIG. 3. A plurality of switches S1 each connect a control-gate line to one of the positive HV drivers, which are denoted as positive HV driver 1 through 8. The plurality of switches S1 preferably switch simultaneously. Positive HV drivers 1 through 8 provide program voltages for program operations. In an exemplary program operation, when one cell or cells in a row, for example, row i, needs to be programmed, the corresponding positive HV driver i provides a high voltage to the respective control-gate line CG1, and the remaining positive HV drivers provide low voltages. Therefore, by using eight positive HV drivers, one row of flash memory cells can be programmed without causing the disturb problem to another row that shares common sources with the row being programmed.

An HV driver for providing a negative high-voltage (referred to as a negative HV driver hereinafter) is used for erase operations. Since each sector may be erased simultaneously, one negative HV driver 1 may be shared by all rows in sector 1. Switches S2 are used to control the connection of control-gate lines CG1 through CG8 to negative HV driver 1. The plurality of switches S2 preferably switch simultaneously, so that all flash memory cells in sector 1 are erased simultaneously. Similarly, a negative HV driver 2 is connected to sector 2 for erasing flash memory cells in sector 2.

In the preferred embodiment, each of the positive HV drivers is shared by more than one row, each in a different sector from others. For example, positive HV driver 1 is connected to row 1 in sector 1 and row 1 in sector 2. Please note that throughout the description, the terms "share" or "shared" are terms of art, and are used to refer to the relationship between control-gate lines CG1 through CG8 and respective HV drivers, regardless of whether switches S1 or S2 are open or closed. More preferably, each of the positive HV drivers 1 through 8 is connected to one and only one row in each of the sectors 1 and 2. Sector 2 includes switches S3 for controlling the connection to positive HV drivers 1 through 8, and switches S4 for controlling the connection to a negative HV driver 2. Furthermore, the flash memory array may further include more sectors, and each positive HV driver is preferably connected to the respective rows of all sectors.

In a first embodiment, positive HV driver 1 is connected to all of the first rows of all of the sectors in the array, and HV driver i is preferably connected to the ith rows of all of the sectors in the array, wherein i is an integer equal to or less than the total number of rows in a sector. Accordingly, the total number of positive HV drivers needed is equal to the number of rows in one sector.

In a second embodiment, the array may be divided into several sub-regions, wherein each sub-region includes more than one sector. In each sub-region, a positive HV driver is connected to all of the respective rows of all of the sectors in the sub-region. All positive HV drivers connected to one sub-region are disconnected from other sub-regions. Accordingly, the total number of positive HV drivers is equal to the number of rows in one sector multiplied by the number of sub-regions.

The preferred embodiments of the present invention have several advantageous features. By separating the control-gates of common-source flash memory cells, the disturb between common-source flash memory cells is reduced, and the program window is improved. Such an improvement, however, comes with no chip area cost.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An array of flash memory cells arranged in a plurality of rows and a plurality of columns, the array comprising:
   a first sector comprising a plurality of rows, each row being connected to a control-gate line;
   a first row comprising a row of flash memory cells in the first sector;
   a first control-gate line connecting control-gates of flash memory cells in the first row;
   a second row of flash memory cells in the first sector, the flash memory cells in the second row sharing a common source-line with the flash memory cells of the first row and each of the flash memory cells of the second row sharing a same bit-line with a respective one of the flash memory cells of the first row, the bit-lines forming the plurality of columns of the array of flash memory cells;
   a second control-gate line connecting control-gates of flash memory cells in the second row, wherein the first and the second control-gate lines are disconnected from each other;
   a second sector comprising a plurality of rows of flash memory cells, each row being connected to a respective control-gate line;
   a first positive high-voltage (HV) driver connected to the first control-gate line in the first sector and a respective control-gate line in the second sector;
   a second positive HV driver connected to the second control-gate line in the first sector and a respective control-gate line in the second sector;
   a first negative HV driver coupled to all of the rows in the first sector; and
   a second negative HV driver coupled to all of the rows in the second sector.

2. The array of claim 1, wherein each control-gate line in the first sector further includes a first switch connecting the control-gate line to a positive HV driver and a second switch connecting the control-gate line to a negative HV driver.

3. The array of claim 1, wherein the rows in the first sector each share a positive HV driver with a respective row in the second sector.

4. The array of claim 3, wherein each row in the first sector is connected to a different positive HV driver than other rows in the first sector.

5. The array of claim 1, wherein no positive HV driver is shared by two rows in the first sector.

6. An integrated circuit comprising:
   an array of memory cells arranged in a plurality of rows and a plurality of columns, wherein the rows are grouped as at least a first sector and a second sector, each sector having a same number of rows, and wherein the array comprises:
   a plurality of control-gate lines connected to the rows of memory cells of the array with a control-gate line connected to control-gates of memory cells in a same row;
   the rows of memory cells being arranged in pairs, wherein, in each pair of rows, a first row of the pair shares common sources and common bit-lines with a second row of the pair, and control-gate lines of the first and the second rows are disconnected from each other;

a plurality of bit-lines connected to the columns of memory cells of the array with a bit-line connected to memory cells in a same column;

a plurality of positive HV drivers, each being connected to a control-gate line in the first sector and a respective control-gate line of a respective row in the second sector; and a first and a second negative high-voltage (HV) driver connected to the first and the second sectors, respectively.

7. The integrated circuit of claim 6, wherein the array comprises additional sectors, and wherein each of the positive HV drivers is connected to respective control-gate lines in all sectors of the array.

8. The integrated circuit of claim 6, wherein the array is divided into sub-regions each comprising more than one sector, and wherein each of the positive HV drivers is shared by respective control-gate lines in all sectors in a sub-region, and wherein control-gate lines in different sub-regions do not share positive HV drivers.

9. The integrated circuit of claim 6, wherein each of the control-gate lines in the first sector further includes a first switch connecting the control-gate line to a positive HV driver, and a second switch connecting the control-gate line to the first negative HV driver.

10. An integrated circuit comprising:
   an array of memory cells arranged in a plurality of rows and a plurality of columns, wherein the array is divided into at least a first sector and a second sector, and wherein each of the first and the second sectors comprises:
   a plurality of control-gate lines each being connected to a row of the array, wherein control-gate lines of rows having common-source memory cells are disconnected;
   a plurality of first switches, each having a first end connected to one of the control-gate lines and a second end connected to a positive high-voltage (HV) driver, wherein the second end of each first switch in the first sector is connected to the second end of a first switch in the second sector; and
   a plurality of second switches, each having a first end and a second end, wherein the first end is connected to one of the control-gate lines, and wherein the second ends of the second switches in one of the first and the second sectors are interconnected and further connected to a negative high-voltage (HV) driver.

11. The integrated circuit of claim 10, wherein the array comprises more than two sectors, and wherein a second end of a first switch in a sector is connected to second ends of respective first switches in all sectors in the array.

12. The integrated circuit of claim 10, wherein a second end of a first switch in the first sector is disconnected from second ends of remaining first switches in the first sector.

13. The integrated circuit of claim 10, wherein a second end of a first switch in the first sector is further connected to a second end of an additional first switch in the first sector, wherein flash memory cells connected to the first end of the first switch share no common sources with flash memory cells connected to the first end of the additional first switch.

14. The integrated circuit of claim 10, wherein the array is divided into sub-regions each comprising more than one sector, and wherein a positive HV driver is shared by respective control-gate lines of sectors in a same sub-region, and wherein no positive HV driver is shared by two sub-regions.

* * * * *